United States Patent [19]

Bittner

[11] Patent Number: 4,823,228
[45] Date of Patent: Apr. 18, 1989

[54] RF HARMONIC MONITOR FOR DETECTING POTENTIAL LIGHTNING STRIKES BY INDUCED CORONA

[75] Inventor: Burt J. Bittner, Palm Bay, Fla.
[73] Assignee: Harris Corp., Melbourne, Fla.
[21] Appl. No.: 152,946
[22] Filed: Feb. 8, 1988
[51] Int. Cl.[4] .................... G01R 29/12; G01R 31/02; H01G 1/08; H05F 3/00
[52] U.S. Cl. .................... 361/218; 324/72; 324/457; 361/117; 361/231
[58] Field of Search ............ 324/72, 77 A, 77 B, 324/455, 457, 458, 459; 361/117, 231, 233, 235, 220, 222, 217, 218; 174/127, 2, 3

[56] References Cited

U.S. PATENT DOCUMENTS

| | | | |
|---|---|---|---|
| 3,260,893 | 7/1966 | De La Cierva et al. | 361/218 |
| 3,790,884 | 2/1974 | Kohl | 324/72 |
| 4,005,357 | 1/1977 | Parkinson | 324/32 |
| 4,017,767 | 4/1977 | Ball | 361/117 |
| 4,245,187 | 1/1981 | Wagner et al. | 324/54 |
| 4,262,254 | 4/1981 | Poss | 324/457 |
| 4,652,694 | 3/1987 | Goldman et al. | 174/3 |
| 4,695,792 | 9/1987 | Roy | 324/83 D |

Primary Examiner—Roy N. Envall, Jr.
Assistant Examiner—David Osborn
Attorney, Agent, or Firm—Antonelli, Terry & Wands

[57] ABSTRACT

An apparatus for detecting the onset of a potential lightning discharge condition monitors the odd harmonics of an RF signal radiated from a conductive probe (antenna) for fluctuations that are representative of an electrostatic condition-induced corona. In response to the such fluctuations, an output signal representative of the onset of said condition is generated. This output signal may be employed to decouple communication equipment from its antenna until the lightning condition has subsided. In accordance with a further aspect of the present invention, there is provided a device for discharging static charge accumulation from a moving body (e.g. an aircraft) which is comprised of at least one discharging conductive wick arranged to be affixed to the trailing edge of a wing, so that charges may flow from the aircraft into the wick and be discharged therefrom. To enhance discharging of the aircraft, a tuned (LC) circuit, resonant at a frequency within an RF spectrum of frequencies of corona discharge currents that flow through the wick, is coupled between the wing and the wick. Once the level of static charge build-up on the aircraft is sufficient to initiate corona discharge, current flow through the resonant circuit begins to self-oscillate and continues to 'ring' after the D.C. voltage level on the body has dropped below that level at which corona was initiated.

18 Claims, 2 Drawing Sheets $$f_{RESONANT} = \frac{1}{2\pi\sqrt{LC}}$$

RF HARMONIC MONITOR FOR DETECTING POTENTIAL LIGHTNING STRIKES BY INDUCED CORONA

FIELD OF THE INVENTION

The present invention relates in general to lightning protection systems and is particularly directed to a device for detecting the onset of a potential lightning discharge condition by monitoring the odd harmonics of a radiated RF signal for the presence of corona-induced amplitude variations.

BACKGROUND OF THE INVENTION

Electrostatic discharge protection systems, most notably lightning protection systems, find use in a number of different environments, such as aircraft, fuel depots, industries which handle toxic and particularly cryogenic materials, power companies, open area recreational facilities (e.g. marinas, golf courses), etc. In the case of lightning, one of the most common forms of protection is the disposition of a conductive electrostatic discharge guide or "lightning rod", the purpose of which is to cause any potentially damaging lightning discharge to be "attracted" to it and thereby directed along a prescribed conductive path that effectively by-passes a facility that would otherwise be subjected to substantial damage that may result from the lightning strike. Unfortunately, because of their composition, location and configuration there are a number of structures, such as radio communication antennas, which inherently possess the lightning attracting characteristics of lightning rods and, consequently, lend themselves as sources of potential harm to their associated communication equipment. For the most part such structures cannot simply be removed, since they perform a necessary function within an overall environment. (For example, in an effort to avoid lightning strikes the user of communication equipment cannot simply dispense with its antenna and expect the equipment to function properly.) Yet, the presence of such lightning rod-type structures remains a potential discharge attraction threat to attendant facilities.

In an effort to reduce the potential harm to facilities that are served by structures that represent a potential lightning attraction threat, there have been proposed a variety of electrostatic discharge warning systems, in response to which a facility user can take protective action in advance of an impending lightning strike condition. In addition to such 'storm warning' schemes, facilities have been fitted with improved discharge devices (such as electrostatic discharge devices employed on aircraft) which are essentially intended to operate as highly efficient lightning rods and thereby rapidly direct any potentially dangerous charge condition away from an area to be protected. For an overview of such warning and protection systems, attention may be directed to the following U.S. patents: U.S. Pat. No. 4,543,580 to Bent et al and the patents cited therein; U.S. Pat. No. 3,260,893 to De La Cierva et al; U.S. Pat. No. 4, 652,694 to Goldman et al; U.S. Pat. No. 4,540,844 to Sautereau et al; U.S. Pat. No. 4,005,357 to Parkinson; U.S. Pat. No. 4,053,875 to Kupersmit; U.S. Pat. No. 3,857,066 to Cline et al; U.S. Pat. No. 3,106,663 to Tanner; and U.S. Pat. No. 4,607,313 to Shaw et al.

SUMMARY OF THE INVENTION

In accordance with one aspect of the present invention, there is provided a new and improved device for detecting the onset of a potential lightning discharge condition through the use of a scheme which monitors the odd harmonics of a radiated RF signal for the presence of corona-induced amplitude variations. For this purpose the device includes a conductive rod or probe (such as an existing AM/TV broadcast antenna) to which a radio frequency electromagnetic wave signal is applied, so as to cause the rod to radiate an R.F. electromagnetic wave. The amplitudes of odd harmonic components of the emitted R.F. signal are monitored for fluctuations that are representative of an electrostatic condition-induced corona. In response to the such fluctuations, an output signal representative of the onset of said condition is generated and which is detectable both as a change in the radiated signal and as a change in the reflected signal frequency component and broad-band impedance on the feed-line transmission-line from the transmitter. Preferably, the conductive rod or probe is substantially vertically oriented and has a pointed tip so as to produce a well defined electric voltage gradient therefrom. The radio wave frequency signal is of sufficient amplitude to cause a prescribed (calibration reference) corona discharge to be produced at the tip of the rod. An output signal is produced in response to a prescribed increase in the amplitude of the monitored harmonic components of the radio frequency signal, resulting from a change in the prescribed corona due to a substantial modification of the electric field gradient in the vicinity of the rod which occurs in the presence of a prescribed electrostatic discharge condition, e.g. electrostatic build-up prior to a lightning strike.

In accordance with a further aspect of the present invention, there is provided a device for discharging static charge accumulation from a moving body (e.g. an aircraft) which is comprised of at least one discharging conductive element (e.g. conductive wick) arranged to be coupled to the body (e.g. affixed to the trailing edge of a wing), so that charges may flow from the aircraft into the wick and be discharged therefrom. To enhance discharging of the aircraft, a tuned (LC) circuit, resonant at a frequency within an RF spectrum of frequencies of corona discharge currents that flow through the wick, is coupled in circuit with (between) the wing and the wick. Once the level of static charge build-up on the aircraft is sufficient to initiate corona discharge (effectively an impulse excitation), current flow through the resonant circuit begins to self-oscillate and continues to 'ring' after the D.C. voltage level on the body has dropped below that level at which corona was initiated. As a consequence, a more complete discharge is obtained.

DETAILED DESCRIPTION

Figure 1:
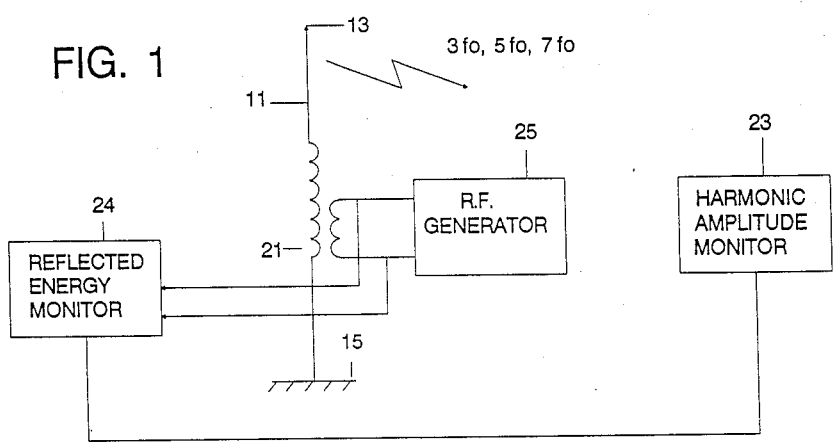
FIG. 1 diagrammatically illustrates an embodiment of an apparatus for detecting the onset of a potential lightning discharge condition in accordance with the present invention.

Referring now to FIG. 1, an embodiment of an apparatus, in accordance with the present invention, for detecting the onset of a potential lightning discharge condition is diagrammatically shown as including a generally vertically oriented conductive rod or probe 11 having a pointed tip 13 at one end thereof and being coupled at its opposite end to ground 15 (via a coupling transformer and loading coil 21). Vertically oriented probe 11 may comprise an element dedicated for the purpose, or it may comprise an existing antenna structure, such as an AM/TV broadcast tower. In the diagrammtical illustration of FIG. 1, coupling transformer 21 is shown as being coupled to a radio frequency (R.F.) signal generator 25. In one practical application of the invention (for example, for use with an airborne communication system), R.F. signal generator 25 may comprise an R.F. transmitter of the aircraft's communication system. However, R.F. generator 25 may also be part of a stand alone unit employed exclusively for lightning detection purposes (for example, as a golf course or marina storm alert unit). As an illustrative example, R.F. generator 25 may produce an excitation frequency on the order of 10 KHz to 300 MHz, in response to which an R.F. electromagnetic wave is radiated by probe 11 via a step-up coupling transformer 21. Preferably the tip of probe 11 is tapered to a sharp point (e.g having a radius of curvature on the order of a tenth of a millimeter), so as to establish a steeply sloped electric field gradient about the tip of the probe and thereby facilitate the formation of a corona thereat.

As pointed out previously, the reduced cross section of the tip 13 of probe 11 increases the slope or sharpness of the electric field gradient around the probe and effectively reduces the potential necessary for initiating the generation of a corona. Typically, detectable current flow begins when the voltage gradient around the probe increases to about 600 volts/mm and becomes quite large (in the immediate vicinity of the tip) when the gradient exceeds about 2 KV/mm. The actual value will, of course, depend on the microscopic radius of curvature of the probe tip (or its 'roughness') and conductivity of the surrounding air (moisture and contaminants). It is for this reason that a lightning rod is usually pointed at its tip. (Another method of enhancing the electric field gradient is to affix to the tip of the probe a radioactive source which continually emits beta particles into the atmosphere, so that there is a low level continuous drift of charge proportional to the gradient surrounding the probe.) On a vertically extending antenna or rod, as diagrammatically illustrated in FIG. 1, a unidirectional discharge current will begin to flow and increase in proportion to the electric field gradient.

Also diagrammatically shown in FIG. 1 is a harmonic amplitude (tuned) receiver 23 by way of which one or more of the generated harmonics ($3f_0$, $5f_0$, $7f_0$, etc.) may be monitored. In the case where a broadcast antenna is employed as the discharge inducing probe element, the antenna may be coupled to a local detector 24 which monitors the corona reflected energy.

Figure 2:
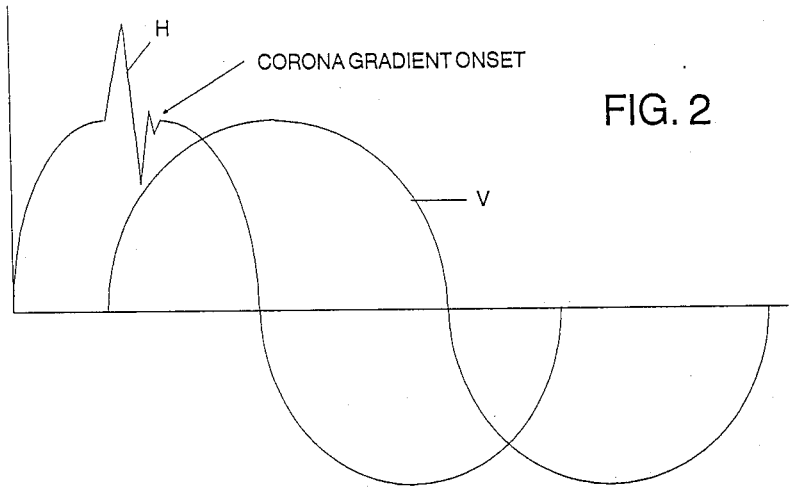
FIG. 2 shows voltage and current characteristics of a monitored RF signal in the presence of corona discharge.

Assuming that the normal gradient in the air surrounding the probe is $+60$ V/M (multiplied by the length (l) of the probe with respect to the ground 15), then, in response to an applied radio frequency signal from generator 25 having an amplitude A, the potential on the probe 11 will vary between ($+A+60$ times the length) volts and ($-A+60$ times the length) volts, so that the electric field is effectively positively biased. When the magnitude of ($A+60$ times the length) exceeds the threshold value at which corona is initiated, current will momentarily flow unidirectionally, as shown, in FIG. 2, by the (odd harmonic) fluctuations H of current signal I. (During the negative half cycle of the applied R.F. voltage signal, these fluctuations are not present, which accounts for the creation of odd harmonics and not even harmonics.) The frequencies of this unsymmetric current fluctuation occur at precisely odd harmonics of the excitation signal $f_o$ and are reflected back to generator 25 and "radiated" as spurious components $3f_o$, $5f_o$, $7f_o$, etc. that are detectable on receivers tuned to these harmonics. (For a more detailed discussion of the properties of electrical discharge and corona harmonic generation attention may be directed to the following text materials: "Fundamental Process of Electrical Discharge in Gases" by L. B. Loeb, Wiley 1939, pp. 378–414, "Gaseous Conductors" by J. D. Cobine, McGraw 1941, pp. 186–289 and "Mobile Whips and Corona" by B. J. Bittner, QST, May 1969).

Typically, the output of a transmitter will contain some low level of harmonic of the base frequency $f_o$, so that by monitoring the harmonics by means of the one or more tuned receivers 24, the presence and magnitude of a corona can be detected as a change in signal strength. Where the magnitude of the excitation potential applied to probe 11 by way of generator 25 is such as to produce a measurable and increasing level of corona activity about probe 11, the output of a harmonic receiver can be calibrated to a threshold against which fluctuations in the harmonic content of the radiated energy resulting from the onset of a unusual levels of atmospheric gradient are referenced. Typical gradients just prior to a lightning strike will range from $-1,000$ to $-5000$ V/M or larger and are readily measurable through a D.C. current meter coupled in circuit at its base to ground connection. However, from a practical standpoint, such a series connection is seldom readily available; consequently, the use of harmonic receivers facilitates monitoring of the corona-induced energy in the radiated signal. Where the lightning detection apparatus is incorporated as part of existing communication equipment, such as the example of an airborne system, the output of a tuned harmonic-monitoring receiver may be coupled to a transmitter protection switch (not shown) provided between the antenna (probe 11) and the transmitter (generator 25), in order to isolate the communication equipment from the antenna until the potentially hazardous storm condition has passed.

Figure 3:
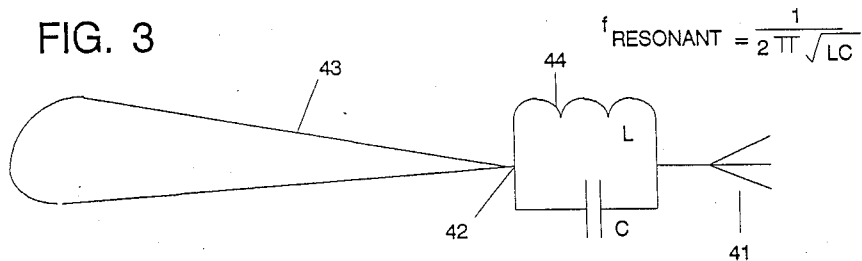
FIG. 3 diagrammatically shows a tuned circuit coupled between a discharging wick and the trailing edge of an aircraft wing.
Figure 4:
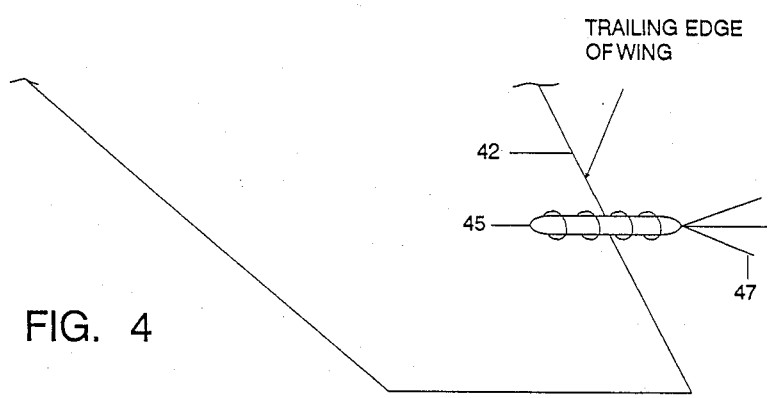
FIGS. 4 and 5 diagrammatically depict configurations of the tuned circuit of FIG. 3.
Figure 5:
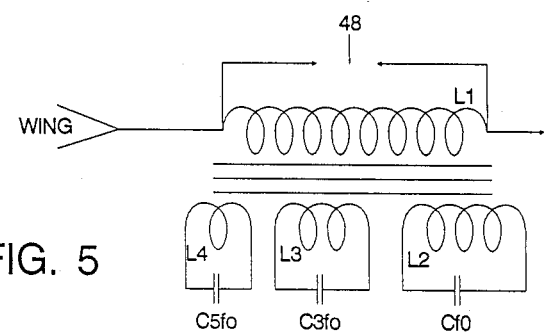

As pointed out above, pursuant to a second aspect of the present invention, there is provided a device for improving the operation of what is commonly known as a discharge 'wick' that is affixed to a body (e.g. attached to the trailing edge of a aircraft wing) for discharging a static charge accumulation from the body. More particularly, using the example of an aircraft wing as shown diagrammatically in FIG. 3, coupled between at least one discharging conductive element (e.g. conductive wick) 41 that is arranged to be coupled to the body (e.g. affixed to the trailing edge 42 of a wing 43), so that charges may flow from the wing 43 into the wick 41 and be discharged therefrom, is a tuned (LC) circuit 44, resonant at a frequency within an RF spectrum of frequencies of corona discharge currents that flow through the wick. This mechanism works best when it is tuned to be a "sympathetic" resonance with the charged body, i.e. a frequency where the (aircraft) body is a half wavelength or where a tower is a quarter wavelength. Once the level of static charge build-up on the body is sufficient to initiate corona discharge (effectively an impulse excitation), current flow through the resonant circuit begins to self-oscillate and continues to 'ring' after the D.C. voltage level on the body has dropped below that level at which corona was initiated. As a consequence, a more complete discharge is obtained. The actual configuration of the tuned circuit may be implemented in the manner illustrated in FIG. 4, which shows a ferrite loop stick or tube 45 bonded to the body (wing trailing edge 42) around which is wound a number of turns of insulated (copper) wire 46. In a practical embodiment, ferrite loop stick 45 may comprise a six inch by one-half inch diameter ferrite rod containing fifty turns of heavily insulated number fourteen copper wire which trail to three inch points 47. A fifty picofarad, 1000 volts mica capacitor may be connected across the ends of the copper coil, as schematically shown in FIG. 3. Rather than use a ferrite rod, a plastic rod or torroids, as described in U.S. Pat. No. 3,365,721, may be employed. However, in this instance, a larger number of turns (of the copper coil) and a larger valued capacitor are required. Moreover, rather than use a single coil, a multiple coil (tank circuits $L_2/Cf_0$, $L_3/C3f_0$, $L_4/C5f_0$ wound around coil $L_1$, with a spark gap 48 to handle direct strikes), harmonic energy configuration, tuned to respective harmonic frequencies, in the manner shown schematically in FIG. 5, may be employed. For a medium sized aircraft wing/helicopter blade, the tuned wick elements maybe tuned to a seldom used frequency (e.g. 10–20 MHz).

It should be noted that the tuned circuit discharge enhancement arrangement of the present invention is functionally different than the (twisted strand) 'noise rejection' filter described in the above-referenced patent to Shaw U.S. Pat. No. 4,607,313. Unlike the Shaw filter arrangement, which is employed as a band rejection filter in order to pass less corona current at the frequencies to which the static discharger is tuned. Pursuant to the present invention, however, the tuned circuit serves to improve the ability of the wick to rapidly conduct corona current away from the aircraft and to achieve a more complete removal of the static charge build-up. This effect of the invention may be readily appreciated from FIG. 6, which shows the 'ringing' characteristic of the tuned circuit(s) in the course of its operation.

Figure 6:
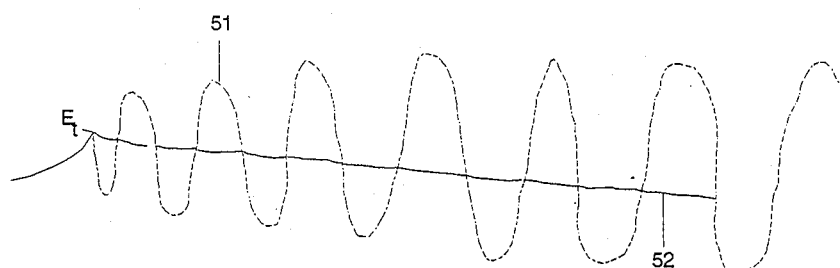
FIG. 6 shows the 'ringing' characteristic of the tuned circuit of FIG. 3 in the course of its operation.

As shown in FIG. 6, as static charge builds up on the surface of the aircraft, there is an continuing increase in its D.C. potential to some level $E_t$ at which point a corona discharge is initiated. Once the level of static charge build-up on the aircraft is sufficient to initiate this corona discharge (effectively an impulse excitation), current flow through the resonant circuit begins to self-oscillate, as shown at 51, and continues to 'ring' after the D.C. voltage level on the body has dropped below that level at which corona was triggered. As a consequence, after a period of time, the D.C. level, shown at 52, will have dropped below its initial value, so that an enhanced or augmented discharge is obtained.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed is:

1. A method of detecting the onset of an electrostatic discharge condition comprising the steps of:
   (a) radiating, from a conductive element, an electromagnetic wave;
   (b) monitoring a characteristic of at least one harmonic component of the electromagnetic wave radiated from said conductive element; and
   (c) in response to a modification of said characteristic of said at least one harmonic component of said radiated electromagnetic wave caused by an electrostatic condition-induced corona, generating an output signal representative of the onset of said condition.

2. A method according to claim 1, wherein said conductive element comprises a substantially longitudinally shaped conductive rod having a pointed tip so as to produce a well defined electric voltage gradient therefrom.

3. A method according to claim 2, wherein step (a) comprises applying a radio wave frequency signal to said conductive rod of sufficient amplitude to cause a corona discharge to be produced thereby, and step (b) comprises monitoring the amplitude of said at least one harmonic component of the radio wave radiated by said rod the amplitude of which is affected by said corona discharge.

4. A method according to claim 3, wherein step (c) comprises generating said output signal in response to a prescribed increase in the amplitude of said monitored at least one harmonic component resulting from a change in said corona due to a substantial modification of the electric field gradient in the vicinity of said conductive rod which occurs in the presence of said prescribed electrostatic discharge condition.

5. A method according to claim 4, wherein said at least one harmonic component comprises at least one odd harmonic of said radio frequency signal.

6. A method according to claim 1, wherein step (a) comprises applying a radio wave frequency signal to said conductive element of sufficient amplitude to cause a corona discharge to be produced thereby, and step (b) comprises monitoring the amplitude of at least one odd harmonic component of the radio wave radiated by said conductive element the amplitude of which is affected by said corona discharge.

7. A method according to claim 6, wherein step (c) comprises generating said output signal in response to a prescribed increase in the amplitude of said monitored at least one odd harmonic component resulting from a change in said corona due to a substantial modification of the electric field gradient in the vicinity of said conductive element which occurs in the i presence of said prescribed electrostatic discharge condition.

8. A method according to claim 1, wherein step (a) comprises applying a radio wave frequency signal to said conductive element of sufficient amplitude to cause a corona discharge to be produced thereby, and step (b) comprises monitoring the amplitude of at least one odd harmonic component of electromagnetic energy reflected back from said conductive element, the amplitude of which component is affected by said corona discharge.

9. An apparatus for detecting the onset of an electrostatic discharge condition comprising:
   a conductive element;
   first means, coupled to said conductive element, for applying thereto an electromagnetic wave signal so as to cause said conductive element to emit an electromagnetic wave;
   second means, coupled to said conductive element, for monitoring a characteristic of at least one harmonic component of the electromagnetic wave emitted from said conductive element; and
   third means, coupled to said second means and responsive to a modification of said characteristic of said at least one harmonic component of said emitted electromagnetic wave caused by an electrostatic condition-induced corona, for generating an output signal representative of the onset of said condition.

10. An apparatus according to claim 9, wherein said conductive element comprises a substantially longitudinally shaped conductive rod having a pointed tip so as to produce a well defined electric voltage gradient therefrom.

11. An apparatus according to claim 10, wherein said first means comprises means for applying a radio wave frequency signal to said conductive rod of sufficient amplitude to cause a corona discharge to be produced thereby, and said second means comprises means for monitoring the amplitude of said at least one harmonic component of the radio wave emitted by said rod the amplitude of which is affected by said corona discharge.

12. An apparatus according to claim 11, wherein said third means comprises means for generating said output signal in response to a prescribed increase in the amplitude of said monitored at least one harmonic component resulting from a change in said corona due to a substantial modification of the electric field gradient in the vicinity of said conductive rod which occurs in the presence of said prescribed electrostatic discharge condition.

13. An apparatus according to claim 12, wherein said at least one harmonic component comprises at least one odd harmonic of said radio frequency signal.

14. An apparatus according to claim 9, wherein said first means comprises means for applying a radio wave frequency signal to said conductive element of sufficient amplitude to cause a corona discharge to be produced thereby, and said second means comprises means for monitoring the amplitude of at least one odd harmonic component of the radio wave emitted by said conductive element the amplitude of which is affected by said corona discharge.

15. An apparatus according to claim 14, wherein said third means comprises means for generating said output signal in response to a prescribed increase in the amplitude of said monitored at least one odd harmonic component resulting from a change in said corona due to a substantial modification of the electric field gradient in the vicinity of said conductive element which occurs in the presence of said prescribed electrostatic discharge condition.

16. An apparatus according to claim 9, wherein said first means comprises means for applying a radio wave frequency signal to said conductive element of sufficient amplitude to cause a corona discharge to be produced thereby, and said second means comprises means for monitoring the amplitude of said at least one harmonic component of electromagnetic energy reflected back from said conductive element the amplitude of which is affected by said corona discharge.

17. An apparatus according to claim 11, further having a device for discharging static charge accumulation from a moving body, the device comprising:
   at least one discharging conductive element arranged to be coupled to said body so that charges may flow from the moving body into said at least one discharging conductive element and discharged therefrom; and
   a resonant circuit, resonant at a frequency within an RF spectrum of frequencies of corona discharge currents that flow through said at least one discharging conductive electrode, coupled in circuit with said body and said at least one discharging conductive element.

18. A device according to claim 17, wherein said resonant circuit comprises a multiturn coil and a capacitor coupled in circuit therewith, affixed to said body and coupled to said at least one discharging conductive element.

* * * * *